United States Patent [19]

Manning et al.

[11] Patent Number: 5,335,202
[45] Date of Patent: Aug. 2, 1994

[54] VERIFYING DYNAMIC MEMORY REFRESH

[75] Inventors: Troy A. Manning; William R. Bachand, both of Boise, Id.

[73] Assignee: Micron Semiconductor, Inc., Boise, Id.

[21] Appl. No.: 84,399

[22] Filed: Jun. 29, 1993

[51] Int. Cl.$^5$ ............................................. G11C 7/00
[52] U.S. Cl. ......................... 365/222; 365/201; 365/233.5; 365/189.02
[58] Field of Search ............... 365/222, 201, 189.02, 365/189.01, 230.01, 233.5, 183

[56] References Cited

U.S. PATENT DOCUMENTS

| | | | |
|---|---|---|---|
| 4,084,154 | 4/1978 | Panigrahi | 365/222 |
| 4,172,282 | 10/1979 | Aichelmann, Jr. et al. | 364/200 |
| 4,639,858 | 1/1987 | Murray, Jr. et al. | 365/222 |
| 4,672,583 | 6/1987 | Nakaizumi | 365/201 |
| 4,933,988 | 6/1990 | Byers et al. | 365/222 |
| 4,935,900 | 6/1990 | Ohsawa | 365/201 |
| 5,193,072 | 3/1993 | Frenkil et al. | 365/222 |
| 5,208,779 | 5/1993 | Walther et al. | 365/222 |
| 5,229,969 | 7/1993 | Lee et al. | 365/222 |

FOREIGN PATENT DOCUMENTS

| | | | |
|---|---|---|---|
| 0019150 | 11/1980 | European Pat. Off. | 365/222 |
| 63-121197 | 5/1988 | Japan | 365/222 |

Primary Examiner—Eugene R. LaRoche
Assistant Examiner—Tan Nguyen
Attorney, Agent, or Firm—William R. Bachand

[57] ABSTRACT

A dynamic memory having self refreshing capability performed without external strobing, is interruptable and can be strobed to initiate a refresh cycle for testing interrupt response timing. In operation of such a dynamic memory, interruption of a self refresh cycle precedes initiation of a read or write cycle by a time $t_{RPS}$, sufficient for row precharge. Although $t_{RPS}$ can be estimated based on worst case analysis, lower $t_{RPS}$ characteristics can be guaranteed, resulting in higher yields, by measuring $t_{RPS}$ during memory fabrication using circuits and methods disclosed. In an alternate embodiment, output of a signal indicative of the beginning of a refresh cycle is enabled by a test signal.

42 Claims, 8 Drawing Sheets

VERIFYING DYNAMIC MEMORY REFRESH

TECHNICAL FIELD

The present invention relates generally to dynamic memory devices and particularly to devices capable of self refreshing.

BACKGROUND

Dynamic memory requires periodic refreshing to maintain the data stored in the memory. Though problems solved by the present invention apply to many types of dynamic memory, consider for this introduction a dynamic memory having an array of cells, each cell storing data as a charge on a cell capacitance.

Refreshing is accomplished by selecting a cell to refresh and recharging the cell capacitor. For memory with self refreshing capability, the act of selecting a cell to refresh is accomplished by refreshing circuits packaged with the memory. Refreshing circuits generally employ an address counter and clock oscillator for selecting a cell to refresh. Refreshing is performed in a so-called refresh cycle during which the address counter is incremented, a cell is selected, and a period of time is allowed for recharging the cell capacitor.

When the memory is performing self refreshing, refresh cycles are back to back, excluding other uses for the memory such as system read/write functions. Thus, when the system in which the memory exists requires use of the memory and the memory is currently performing self refreshing, the current refresh cycle must be terminated quickly so that the memory can respond to a read/write cycle as directed by the system.

When a system read/write cycle is begun soon after self refreshing has been interrupted, the cell selected during the last refresh cycle may not be properly refreshed. In an extreme case, the data stored in the cell is corrupted. Manufacturers of dynamic memory publish timing guidelines for systems designers including a time $t_{RPS}$ required between an interruption of self refreshing and the beginning of the earliest subsequent system read/write cycle. Systems designs, therefore, accommodate the time $t_{RPS}$ to avoid the possibility of improper refreshing and data corruption.

In the conventional dynamic memory capable of self refreshing, back to back refresh cycles are initiated in the absence of cycle by cycle signaling from the system to the memory. In addition, there is no signaling from the memory to the system indicating the beginning of a self refresh cycle. Consequently, there is no way to determine whether a given time is within $t_{RPS}$ for a particular memory device or a production lot of memory devices.

Thus, there remains a need for self refresh circuitry and methods that permit measurement of the shortest delay between interruption of self refreshing and the beginning of a system read/write cycle. In the absence of measurement, manufacturer's published timing guidelines include unnecessarily long delay allowances based on worst case conditions and margins for fabrication process variation. Without measurement, system designs must accommodate these conservative estimates of the delay resulting in poor system performance, slow system response, low system throughput, and generally limited system capability.

SUMMARY

Accordingly, a memory in one embodiment of the present invention includes a dynamic cell for data storage, means for storing and recalling data, means for self refreshing additionally responsive to a control signal, and means for generating the control signal in response to detecting a test signal.

According to a first aspect of such a memory, a sequence of signals to and from the memory verifies self refreshing, i.e. that the last refresh cycle prior to interruption was completed properly.

According to another aspect, the last refresh cycle is begun at a known time, i.e. the time the test signal is received by the memory, permitting worst case testing. For example, a delay between interruption of self refreshing and the beginning of a system read/write cycle can be verified in the worst case when interruption (signalled to the memory) immediately follows initiation of the last refresh cycle (signalled to the memory).

According to yet another aspect, the test signal comprises a voltage different from the voltage of signals the memory receives during non-test operations and there are no additional interface lines needed to practice the invention. Therefore, systems designed for conventional memory are compatible with memory of the present invention.

The present invention may be practiced according to a method which includes in one embodiment the steps of storing data in the cell; enabling self refreshing; directing self refreshing by inputting to the memory a test signal so that refreshing of the cell begins after receipt of the test signal; disabling self refreshing at a first time; reading data from the cell at a second time; and determining that the period from the first time to the second time is sufficient for refreshing by comparing the data read to the data stored.

According to a first aspect of such a method, exhaustive testing of the memory can be accomplished in reasonable time by arranging the second time to occur at a worst case time interval from the first time.

In another embodiment of the present invention, a memory includes a dynamic storage cell, means for read and write access, means for refreshing, and means for detecting a test signal. The refreshing means refreshes the cell after an absence of read and write control signals for a first time. In response to a third control signal, the refreshing means refreshes the cell and provides a refresh cycle signal. The detecting means enables outputting of the buffered third control signal in response to the test signal.

According to a first aspect of such a memory, $t_{RPS}$ can be measured as the time between the buffered third control signal output from the memory and a subsequent read control signal.

The present invention may be practiced with such a memory according to a method which includes in one embodiment the steps of storing data in the cell; enabling self refreshing; enabling the output of a refresh cycle signal occurring at a first time; disabling self refreshing at a second time; reading data from the cell; and determining that the period from the first time to the second time is sufficient for refreshing by comparing the data read to the data stored.

According to a first aspect of such a method, measurement of $t_{RPS}$ involves less circuitry in the memory and in the test setup.

According to another aspect of such a method, the measurement system can verify memory operation at a given $t_{RPS}$ without knowledge of the duration of a refresh cycle.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

In each functional block diagram, a broad arrow symbolically represents a group of signals that together signify a binary code. For example, a group of address lines is represented by a broad arrow because a binary address is signified by the signals taken together at an instant in time. A group of signals having no binary coded relationship is shown as a single line with an arrow. A single line between functional blocks represents one or more control signals.

Signals that appear on several Figures and have the same mnemonic are directly or indirectly coupled together. A signal named with a mnemonic and a second signal named with the same mnemonic followed by an asterisk are related by logic inversion.

In each timing diagram the vertical axis represents binary logic levels and the horizontal axis represents time. Neither axis is drawn to scale. The vertical axis is intended to show the transition from active (asserted) to passive (non-asserted) states of each logic signal. The voltage levels corresponding to the logic states of the various signals are not necessarily identical among the various signals.

DESCRIPTION

Figure 1:
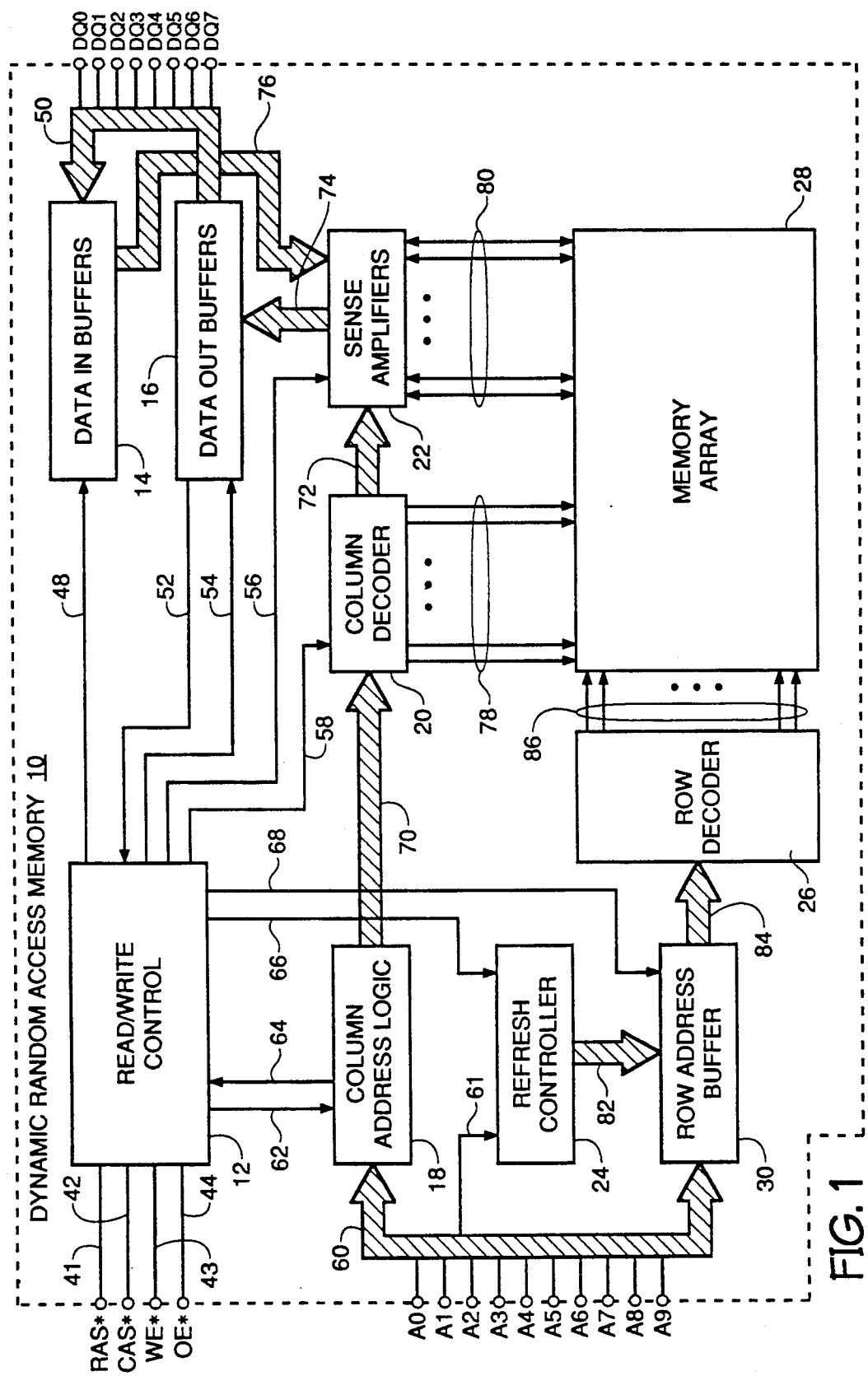
FIG. 1 is a functional block diagram of a dynamic memory of an embodiment of the present invention.

FIG. 1 is a functional block diagram of a dynamic memory of one embodiment of the present invention. Memory device 10 is controlled by binary control signals input on lines 41 through 44 from the device pads to read/write control 12. Control signals on lines 41–44 are conventionally known by names corresponding to the primary function of each signal. The primary signal on line 41 is row address strobe (RAS*; on line 42 is column address strobe (CAS*); on line 43 is write enable (WE*), and on line 44 is output enable (OE*). When RAS* falls, the state of address bus 60 is latched in row address buffer 30 in response to control signals on line 68. When CAS* falls, the state of address bus 60 is latched in column address logic 18 in response to control signals on line 62.

Several read and write modes of operation (also called cycles) are conducted by read/write control 12 in response to address change signals on line 64 and combinations of control signals on lines 41–44. For example, read/write control 12 responds to changes in the column address as indicated by address change signals on line 64 for improved access time as in page mode. Read/write control 12 generates control signals on lines 48–58 for two different write cycles. The first, early write, follows a RAS*, WE*, CAS* control signal sequence. The second, late write, follows a RAS*, CAS*, WE* control signal sequence.

When RAS* falls while CAS* is low, read/write control 12 provides signals on line 66 to refresh controller 24 to enable self refreshing. In one embodiment, the group of signals shown as line 66 includes RAS*, CAS*, and WE* from lines 41, 42, and 43. Refresh controller 24 includes a clock circuit and means for selecting a cell to refresh. During self refresh mode, refresh controller 24 generates signals on refresh row address bus 82 (for example, as generated by the output of a refresh row address counter or register clocked by an oscillator) to select a row of cells to refresh. Row address buffer 30 provides signals on row address bus 84 to row decoder 26. Signals on binary row address bus 84, in response to control signals on line 68, represent either the address latched when RAS* falls or the refresh row address, depending on the mode of operation. During a refresh cycle, data signals on lines 80 from the selected row are amplified by sense amplifiers 22 causing cells in the row to be refreshed.

In addition to cell refreshing, sense amplifiers 22 respond to control signals on line 56 and column decoder signals on line 72 to perform the memory read cycle. Signals RAS*, CAS*, WE* (high), and address signals A0 through A9 cooperate to provide a control signal for a read cycle. In read operations cell content signals on lines 80 are amplified and presented to data out buffers 16 as global I/O signals on line 74. When cell contents are to be overwritten in a write operation, sense amplifiers 22 establish proper cell contents in response to write data signals on line 76 from data-in buffers 14.

Data-in buffers 14 are instrumental for write operations. Signals RAS*, CAS*, WE* (low), OE*, and address signals A0 through A9 cooperate to provide a control signal for a write cycle. In write operations cell contents are changed to correspond to the outputs on line 76 of data-in buffers 14. Data in buffers 14 are driven by data bus 50 which comprises several individual data lines shown as $DQ_n$.

Memory device 10 has eight DQ lines, each of which is bidirectional. Alternate memory devices may have less or more DQ lines and may have separate lines for the data-in (D) function and the data-out (Q) function. In memory device 10, each bidirectional line is driven by a three state circuit to represent a logic low, a logic high, or an off state. In the off state, the three state circuit connects a high impedance to the DQ line so that drive circuits external to memory device 10 can drive a signal onto the DQ line for data-in buffer 14.

Improved timing test capability is provided in memory 10 in one embodiment by the cooperation of signals on lines 41–43, a signal on line 61, and novel functions of refresh controller 24. Line 61 represents one of the signal lines for signals A0 through A9. A signal on line 61 and a signal on line 43 cooperate to provide a test signal.

In another embodiment improved timing test capability is provided by the cooperation of signals on lines 41, 42, a signal on line 61, and novel functions of data-out buffers 16. The test signal in the later embodiment includes a signal on line 61 without reference to signals on line 43. Realization of improved timing test capabilities will become more apparent upon review of lower level block diagrams to be discussed.

In an equivalent dynamic memory, not shown, storage cells are arranged in a ring rather than in a row-column array as shown in FIG. 1. In such an arrangement, control and address signals different from those shown in FIG. 1 comprise the control signals for a read and a write operation. Storage ring architectures include magnetic bubble and charge coupled devices as is well known in the art.

In another equivalent memory, not shown, memory 10 additionally includes serial access means coupled to sense amplifiers 22 for providing serial access between the memory array and a serial input/output buffer circuit. In such a memory, control signals 56 include a transfer signal for enabling data transfer between array 28 and the serial access means.

Figure 2:
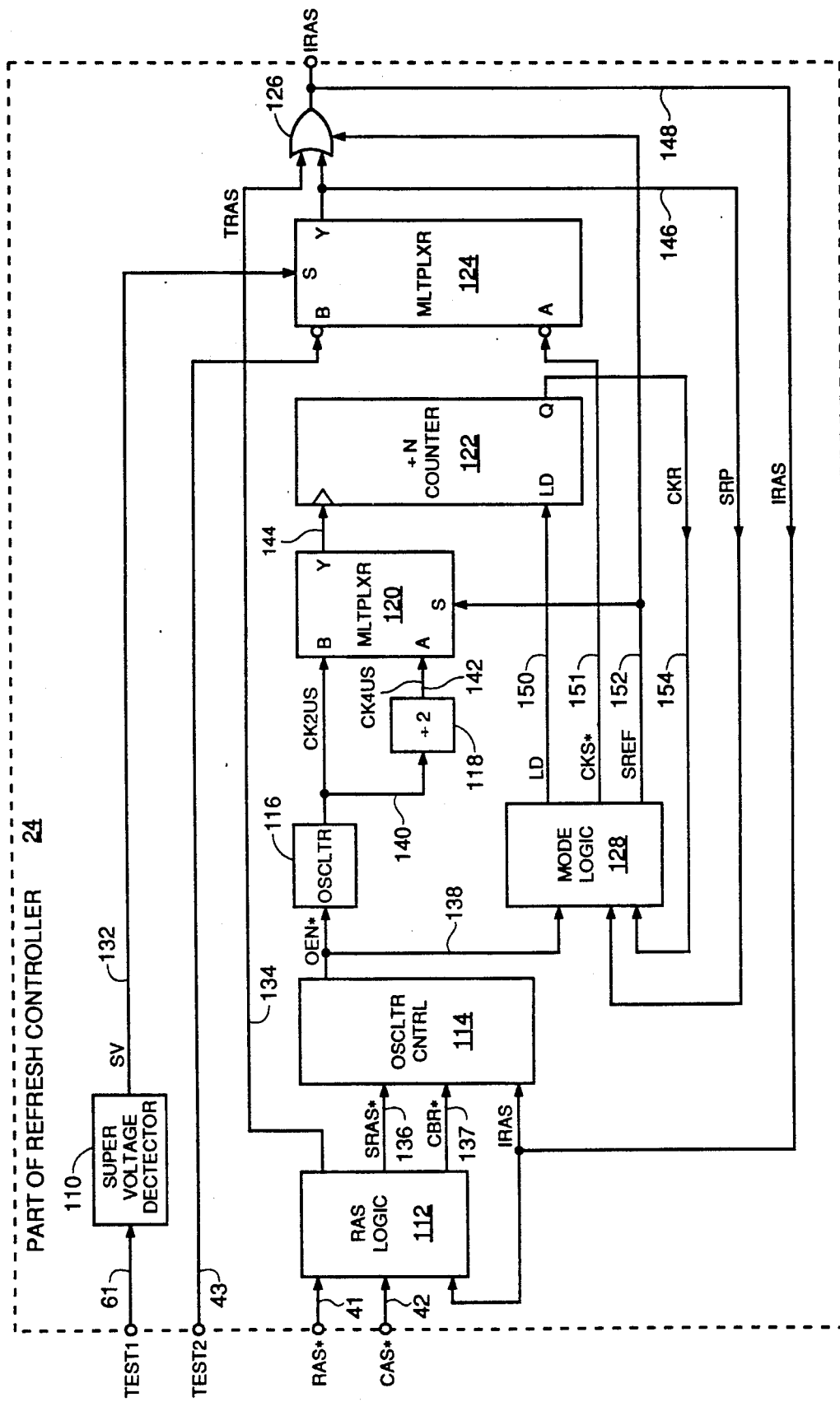
FIG. 2 is a functional block diagram of a portion of refresh controller 24 shown in FIG. 1.

FIG. 2 is a functional block diagram of a portion of refresh controller 24 shown in FIG. 1. The output of the circuit shown is signal IRAS on line 148 which is used as an internal row address strobe. In response to IRAS, a row is selected for refreshing, and a refresh row address counter, not shown, is incremented. IRAS in the embodiment shown is used to indicate the beginning of each row-by-row refresh cycle after refreshing has been initiated.

RAS logic 112 monitors signals RAS* and CAS* to detect when to initiate and terminate self refreshing and consequently generates control signals. Signal TRAS on line 134 is generated as a pulse of predetermined length and used to establish a proper pulse width for signal IRAS on line 148. The formation of the TRAS signal is triggered by signal IRAS input to RAS logic 112. Signal SRAS* on line 136 is generated by buffering signal RAS* so that termination of self refreshing follows soon after the rising edge of signal RAS*. The beginning of a CAS* before RAS* self refresh cycle is indicated by signal CBR* on line 137 for controlling refresh clock generation.

Oscillator control 114, responds to signals SRAS* and CBR* to enable oscillator 116 to oscillate during self refreshing. Oscillator 116, when enabled, generates, in one embodiment a clock having a period of about two microseconds as signal CK2US on line 140. A second clock having a period twice as long as the period of signal CK2US on line 142 results from division of signal CK2US. These clock signals are used for measuring time using a counter.

Modulo N counter 122 responds to the clock signal on line 144, selected by multiplexer 120, and to a load signal LD on line 150. Counter 122 loads an initial count in response to signal LD and counts clock signals on line 144 until a terminal count is reached, whereupon signal CKR is generated on line 154. The internal RAS signal, IRAS, is developed from signal CKR via mode logic 128 or from signal TEST2 in cooperation with signal TEST1 via multiplexer 124.

Mode logic 128 holds counter 122 at the initial count when oscillator 116 is not enabled. When oscillator 116 is enabled, mode logic 128 generates signal LD on line 150 after the terminal count is reached, as indicated by signal CKR. In the embodiment shown, signal CKR is used to form a pulse signal CKS* on line 151. The CKS* pulse is then gated through multiplexer 124 as self refresh pulse signal SRP on line 146.

Mode logic 128 controls counter 122 as a timer for measuring the self refresh setup time and the self refresh cycle time. When signal CBR* indicates self refreshing may begin, mode logic 128 holds self refresh mode signal SREF on line 152 low so that slower clock signal CK4US is coupled to counter 122. Self refresh cycles do not begin before a self refresh setup time has elapsed during which neither a read signal nor a write signal occurs, i.e. while signal CBR* remains asserted and signals RAS* and CAS* are absent. The self refresh setup time has elapsed when the terminal count occurs and signal CKR issues as a consequence of the rate prescribed by signal CK4US and the magnitude of the initial and terminal counts.

Mode logic 128 raises signal SREF after the first terminal count is reached. When signal SREF on line 152 is high (asserted), faster clock signal CK2US is used to measure the time between back to back refresh cycles. In the embodiment shown, the self refresh setup time is twice the self refresh cycle time and the initial count is fixed as a metal mask option during integrated circuit fabrication. Those skilled in the art understand that a selection of initial counts could be used as the functional equivalent of clock division and selection. Also, accommodation of an other than two to one relationship between the self refresh setup time and the self refresh cycle time (for example, to support burst refreshing) involves mere design choice in clock rate, initial count, terminal count, and mode logic.

After self refresh mode is entered, as indicated when signal SREF is asserted, subsequent CKR signals are coupled as CKS* signals through multiplexer 124. Signal SREF, when asserted, also enables gate 126 so that multiplexer output signal SRP on line 146 is combined in a logic 'or' with signal TRAS through gate 126.

Self refresh mode is interrupted by a test signal to direct the initiation of a final refresh cycle prior to terminating self refreshing. In the embodiment shown, the test signal includes a high voltage signal on a line used otherwise for an address signal and includes a pulse on a line used otherwise for a write enable signal. Super voltage detector 110 operates as a means for providing a multiplexer control signal (SV). Detector 110 and selection logic in multiplexer 124 cooperate as a means for detecting the test signal. Detector 110 includes a comparator for comparing a signal TEST1 on line 61 to a fixed threshold voltage. The threshold voltage is selected by design so as to be easily distinguishable from non-test related signals. Although a distinguishable voltage magnitude is used in the embodiment shown, virtually any other signalling characteristic could be used, with appropriate means for detecting the test signal. In the embodiment shown, memory device 10 is powered by a supply voltage and the magnitude of the supply voltage is used as the threshold. When the threshold is exceeded, detector 110 provides signal SV on line 132.

After signal SV has been asserted, a time sufficient for the presently occurring refresh cycle to be completed must pass. Then, to initiate the final refresh cycle, a pulse signal TEST2 on line 43 is gated through multiplexer 124 to generate the IRAS signal. The IRAS signal, so generated, triggers signal TRAS through RAS logic 112 which in turn forms the IRAS pulse of the proper duration by operation of gate 126. The operation of a circuit embodiment of the functions shown in FIG. 2, especially operation to measure time $t_{RPS}$, will be better understood with reference to a timing diagram.

Figure 3:
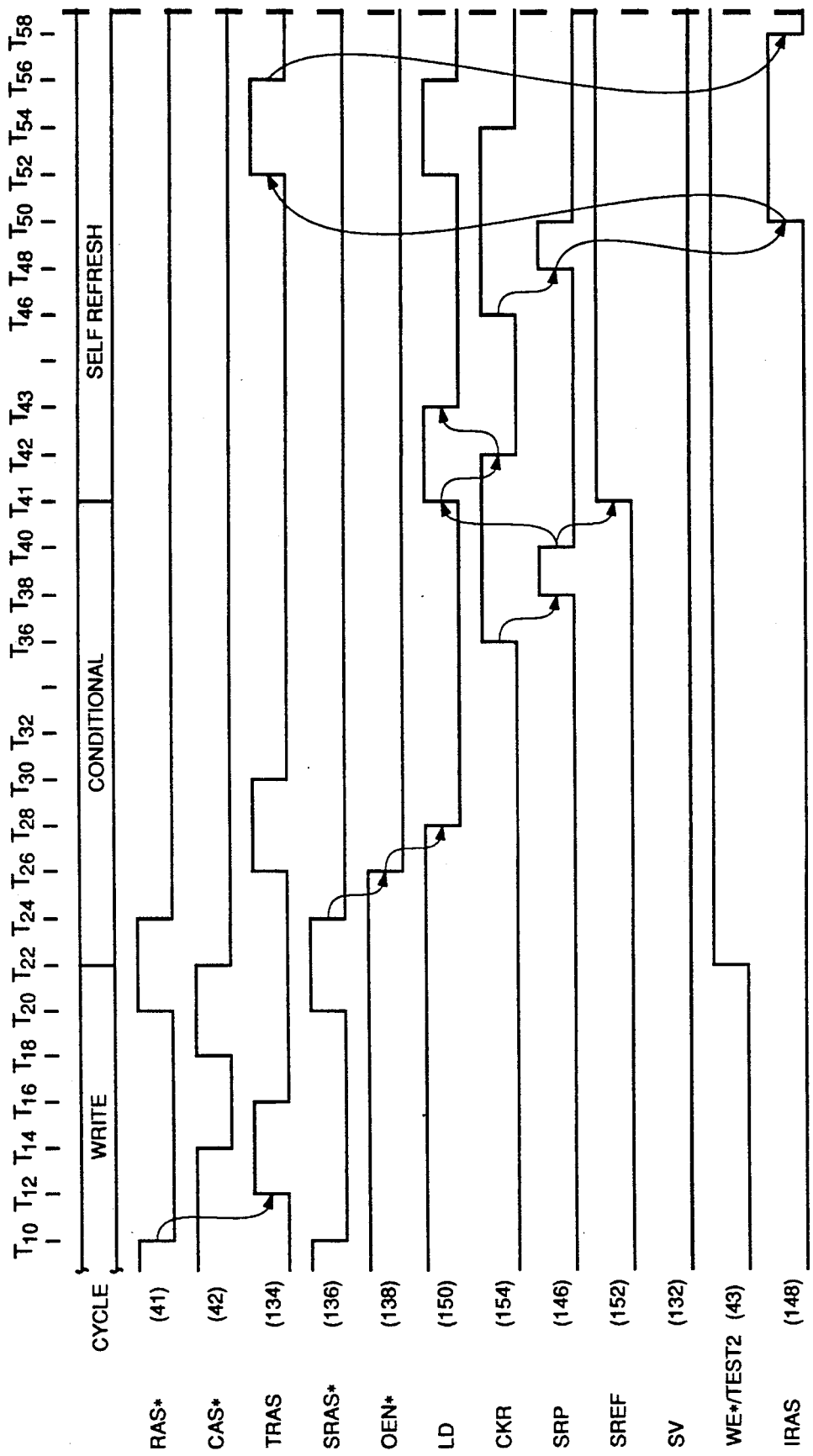
FIGS. 3 and 4 are timing diagrams of signals shown in FIG. 2.
Figure 4:
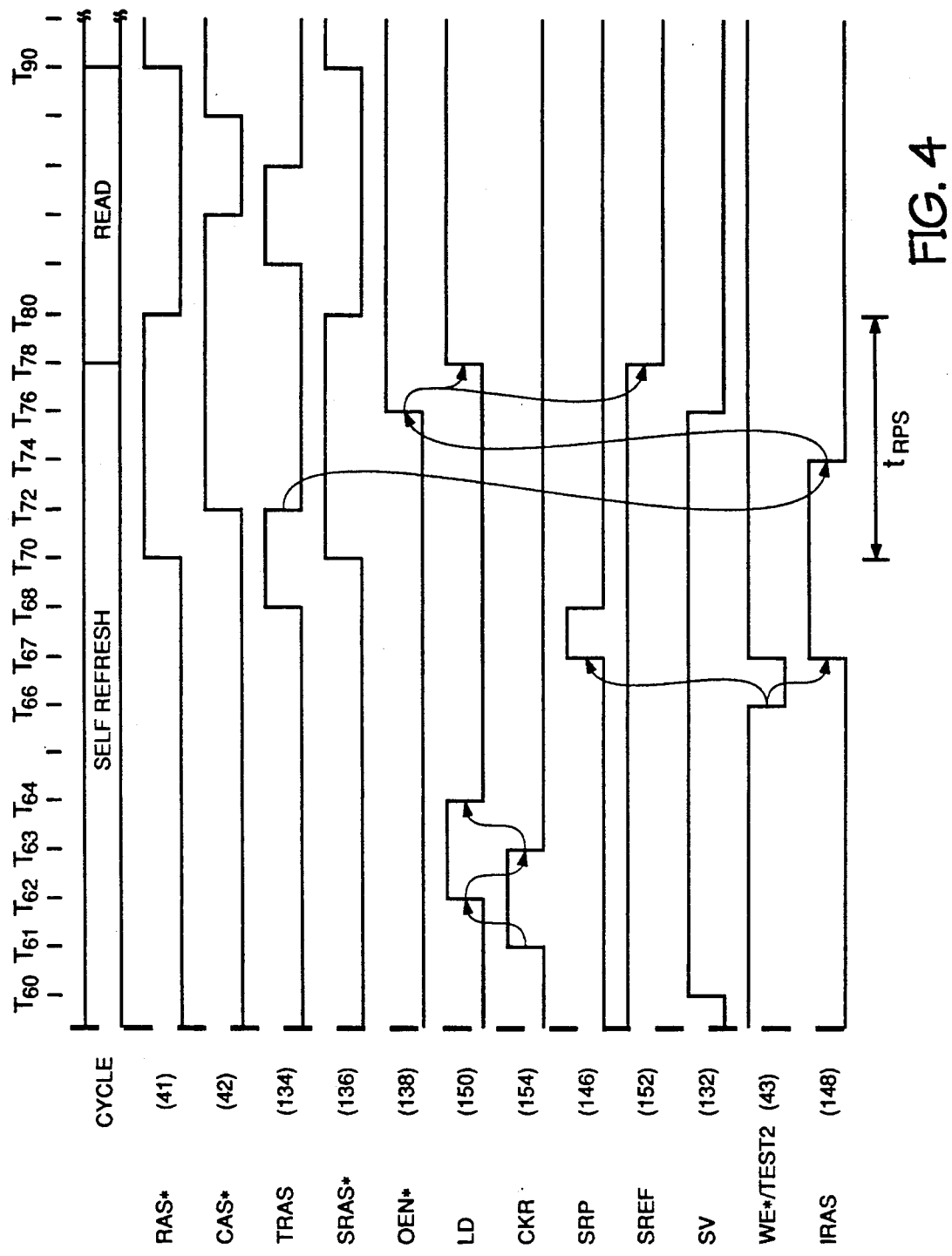

FIGS. 3 and 4 are timing diagrams of signals shown on FIG. 2. FIGS. 3 and 4 present five consecutive cycles. An early write cycle is presented from time T10 to time T22 wherein data is stored in a cell of the dynamic memory. A conditional cycle satisfying a self refresh setup time specification from time T22 to time T41 is followed by self refreshing from time T41 to time T78. During self refreshing, a self refresh cycle is illustrated from time T41 to time T52 and a directed final refresh cycle is shown from time T60 to time T78. Finally, a read cycle for reading data from a cell of the dynamic memory is presented from time T78 to time T90.

To verify that a period shown between time T70 and time T80 meets a $t_{RPS}$ specification for memory 10, data is stored in the array via a plurality of write cycles. After all cells in the array have been written to a known state, self refreshing is enabled. Signal CAS* falls before signal RAS* at time T22. When both signals are low, signal OEN* enables oscillator 116 and disables continuous loading of counter 122 so that counting can begin. Counter 122 measures the self refresh setup time from time T28 to time T36, then is reloaded at time T41 to measure the time between back to back refresh cycles.

The first self refresh cycle extends from time T41 to time T52. At the end of the cycle, the first occurrence of self refresh pulse signal SRP in self refresh mode (SREF high) raises IRAS. IRAS pulse width is extended by the duration of signal TRAS and falls at time T58 after TRAS falls at time T56. The period from time T46 to time T58 has been greatly expanded to show the causative relations between signals. In one embodiment the period from time T42 to time T46 is about 125 microseconds and the period from time T46 to time T58 is about 2 microseconds.

Self refreshing is interrupted at time T60 when signal SV is raised as shown on FIG. 4. When signal SV is raised, signal SRP is no longer generated as a consequence of reaching the terminal count. Because counter 122 may not be at the initial count when signal SV was raised, a period greater than or equal to one refresh cycle duration must pass from time T60 before directing the final refresh cycle via signal TEST2 at time T66.

At time T66, a low true pulse signal TEST2 on line 43 is gated through multiplexer 124 to form signal SRP and gated through gate 126 to form signal I RAS. The pulse width of signal IRAS is extended until after signal TRAS falls at time T72.

At time T70, signal RAS* is raised to terminate self refreshing. RAS logic 112, in response to RAS* high takes CBR* high so that, in the absence of signals CBR* and IRAS, oscillator control 114 raises signal OEN*, terminating oscillation at time T76. In response to OEN* high, mode logic 128 forces counter 122 to the initial count by raising signal LD at time T78. Finally, mode logic 128 takes signal SREF low to disable gate 126 and to provide signal CK4US to counter 122 in preparation for the next conditional cycle.

At time T80, signal RAS* falls to test whether a period from time T70 to the time RAS* falls satisfies a minimum $t_{RPS}$ timing specification, i.e. whether the time T70 to the time RAS* fell was sufficient for proper refreshing of the cell or cells addressed in the final refresh cycle. If data (at the address used in the final refresh cycle) as read via a read cycle illustrated from time T80 to time T90 does not match the data previously stored at that address, the time from time T70 to the time signal RAS* fell did not meet the minimum $t_{RPS}$ specification. When the address used in the final refresh cycle is not known, all addresses are read and compared to data previously stored, for example, during the write cycle beginning at time T10. Having discussed how to test a minimum $t_{RPS}$ specification, we now turn to a circuit realization of the block diagram.

Figure 5:
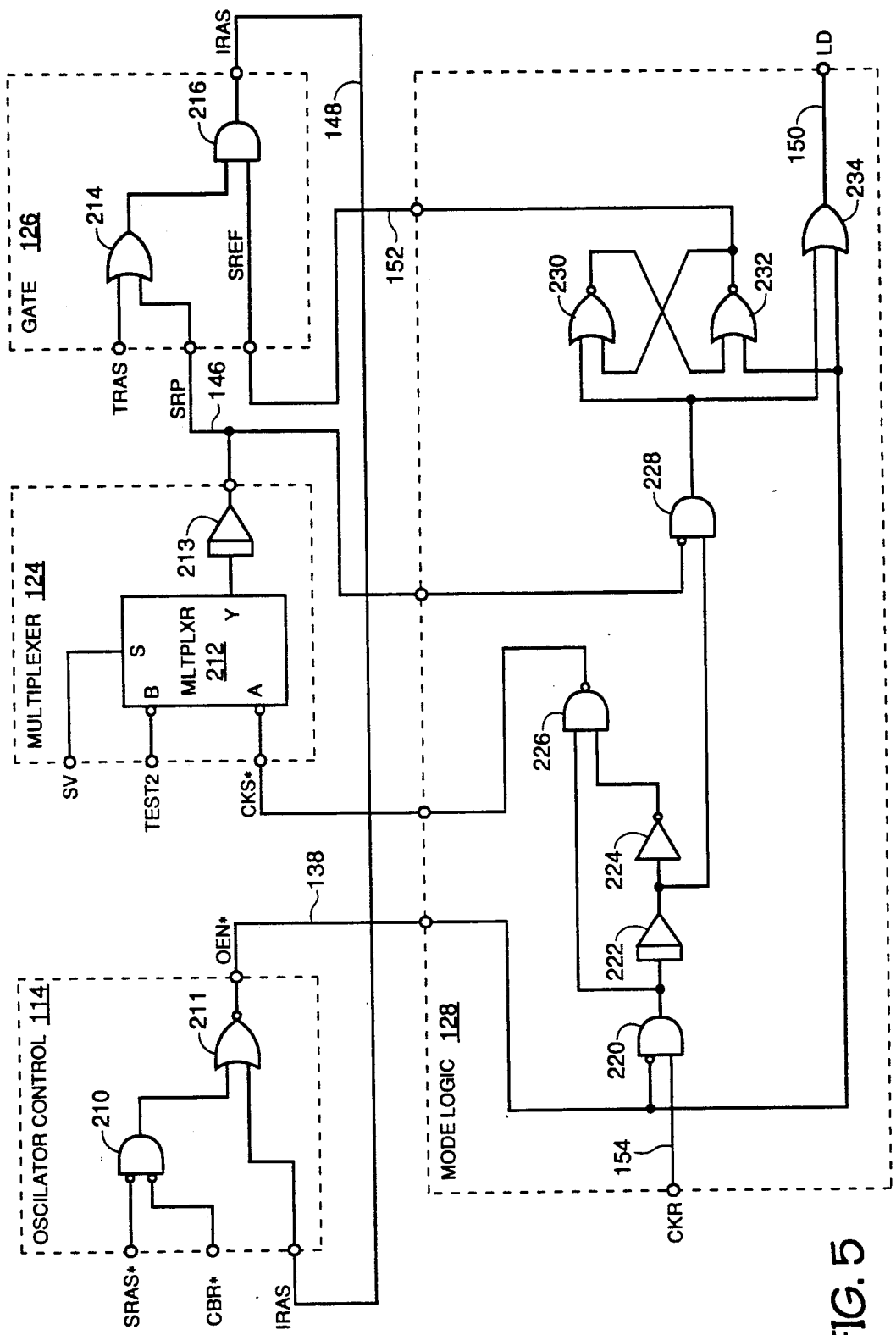
FIG. 5 is a schematic diagram of portions of refresh controller 24 shown in FIG. 2.

FIG. 5 is a schematic diagram of portions of the refresh controller shown in FIG. 2. Mode logic 128 is shown with portions of other circuitry to which it connects. Because the implementation is asynchronous, delay elements such as 213 and 222 have been included to eliminate race conditions between signals. The extent of delays shown and additional delays not shown depend on the propagation delay characteristics of the devices selected by the designer to carry out the invention. Timing analysis and circuit modification are conventional steps in asynchronous logic design and are well understood in the art.

In oscillator control 114, signal OEN* is developed from the logic combination of signals SRAS* and CBR*. Signal IRAS serves to lengthen the time during which signal OEN* is asserted.

In multiplexer 124, when signal SV is low, a low true pulse signal CKS* at inverting input 'A' is coupled to output 'Y'. Similarly, when signal SV is high, signal TEST2 at inverting input 'B' is coupled to output 'Y'. A delay element 213 is interposed in the output circuit to avoid the generation of unwanted signals at the output of gates 228 and 214.

Gate 126 is implemented with or-gate 214 and and-gate 216. In an equivalent embodiment, not shown, signal SREF controls the output circuitry of gate 214 so that signal IRAS is generated without interposing the propagation delay of gate 216.

Mode logic 128 includes an edge triggered pulse generator circuit and a flip-flop circuit. Delay element 222 and gates 224 and 226 cooperate to form a pulse from the rising edge of signal CKR. Gates 230 and 232 form a flip-flop for generation of signal SREF. When signal OEN* is high, gate 232 generates a low SREF signal. When signal OEN* is low, the flip-flop maintains its prior state (SREF low) until the output of gate 228 goes high, which occurs for example at time T38 on FIG. 4. Operation of the flip-flop prevents a pulse from appearing on line 148 during the conditional cycle.

Figure 6:
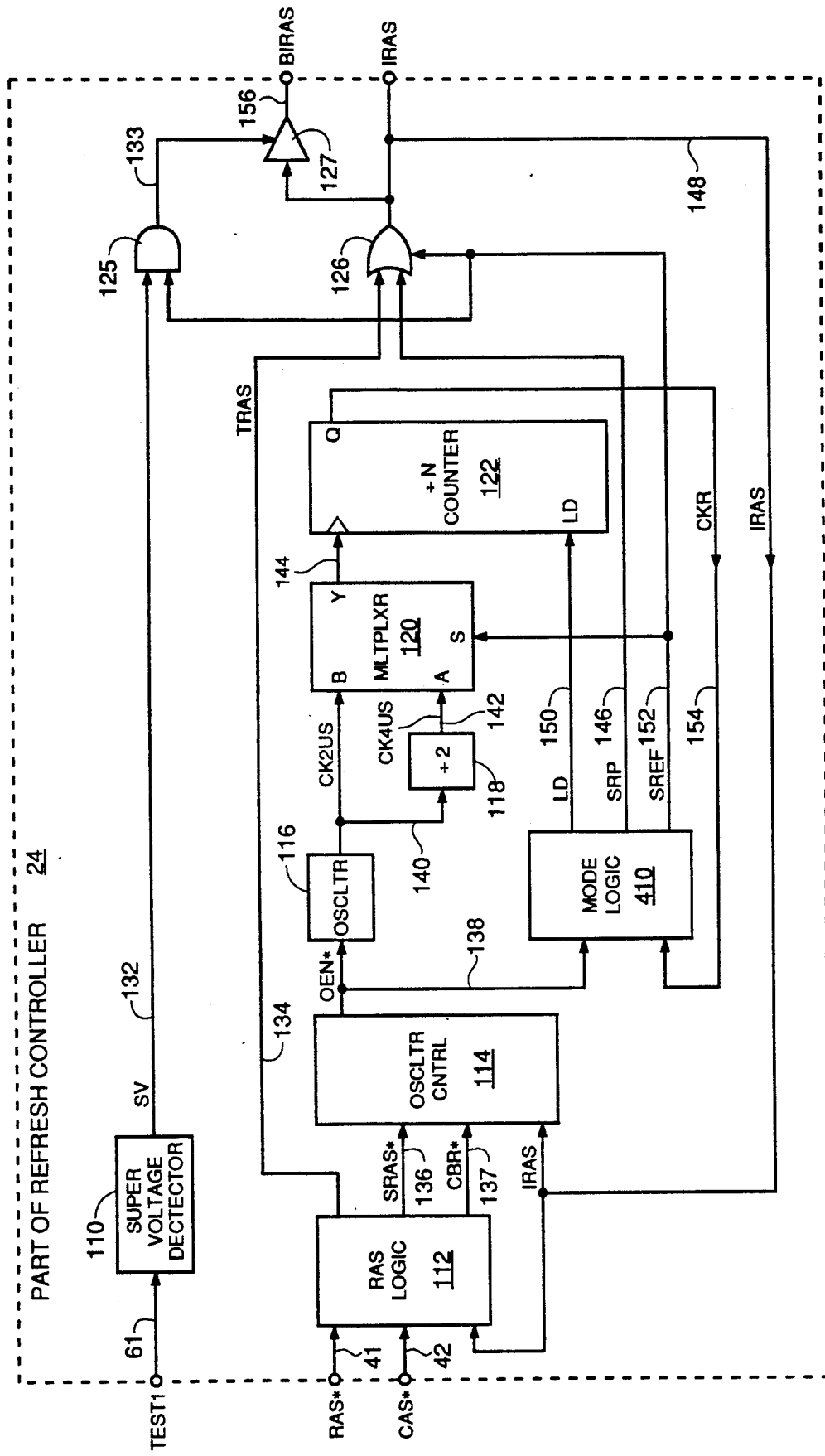
FIG. 6 is a functional block diagram of another embodiment of a portion of refresh controller 24 shown in FIG. 1.

FIG. 6 is a functional block diagram of another embodiment of a portion of refresh controller 24 shown in FIG. 1. Similarly identified signals, lines, and functional blocks shown in FIG. 2 and in FIG. 6 perform identical functions. Differences between the two figures include deletion of multiplexer 124 from FIG. 6, replacement of mode logic 128 with mode logic 410, and addition of gates 125 and 127.

The test signal for the embodiment shown in FIG. 6 is signal TEST1 on line 61. When the magnitude of signal TEST1 exceeds a threshold voltage, super voltage detector 110 produces signal SV on line 132 in a manner as already discussed with FIG. 2. Signal SV and signal SREF on line 152 are combined by gate 125 to enable gate 127 during self refreshing. When enabled, a buffered IRAS signal (BIRAS) is provided on line 156 in response to signal IRAS on line 148. Line 156 is one of several individual data lines which comprise data bus 50, shown in FIG. 1. As shown in FIG. 6, the signal appearing on line 156 is a buffered IRAS signal when signal SV is asserted during self refreshing, and is a DQ signal, for example DQ0, otherwise.

Figure 7:
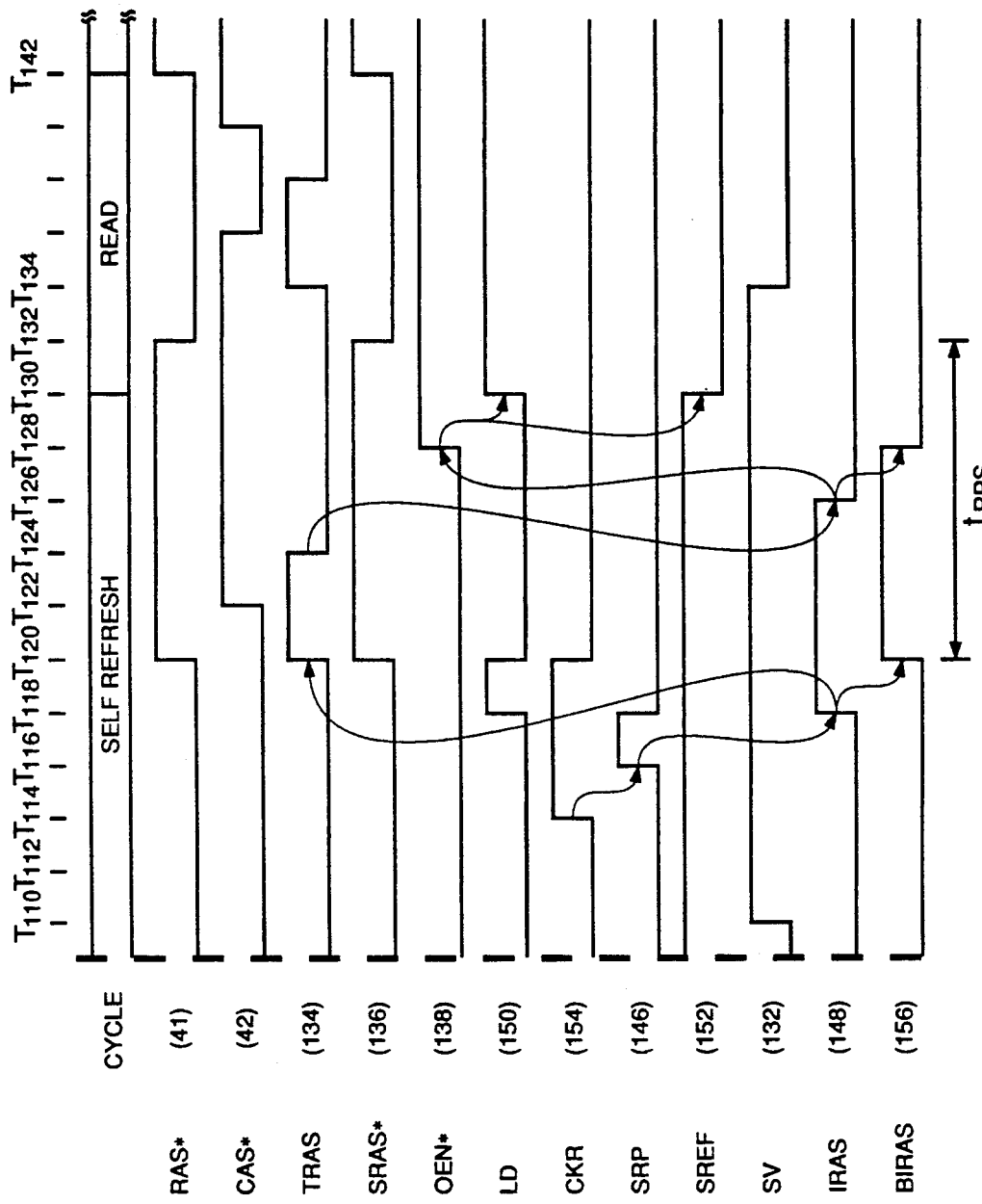
FIG. 7 is a timing diagram of signals shown in FIG. 6.

FIG. 7 is a timing diagram of signals shown on FIG. 6. FIGS. 3 and 7 taken together present five cycles. The early write cycle, conditional cycle, and first self refresh cycle have already been discussed. The later portion of the final refresh cycle, illustrated from time T110 to T130 on FIG. 7, differs from the directed final refresh cycle shown on FIG. 4. Differences will be discussed below. The read cycle for reading data from a cell of the dynamic memory is presented from time T130 to time T142 and is identical to the read cycle shown on FIG. 4.

To verify that a time period shown between time T120 and time T132 meets a $t_{RPS}$ specification for memory 10, data is stored in the array via a plurality of write cycles. After all cells in the array have been written to a known state, self refreshing is enabled and a first refresh cycle occurs as shown on FIG. 3. For the embodiment shown in FIG. 6, signal SV is asserted at any time prior to the final cycle, for example at time T110. Each subsequently occurring IRAS signal will be coupled to line 156 as signal BIRAS. The terminal count of counter 122 is reached at time T114 raising signal CKR. Between times T114 and T126, signals CKR, SRP, IRAS, TRAS, and LD are formed in the manner described with reference to FIG. 3 between times T46 and T58.

Self refreshing is interrupted at time T120 when signal RAS* goes high, illustrating a worst case $t_{RPS}$ scenario. As shown, signal RAS* goes high just as a refresh cycle has begun as indicated by signal BIRAS. After signal TRAS falls at time T124, signal IRAS falls at time T126 and signal BIRAS falls at time T128. RAS logic 410, in response to RAS* high takes CBR* high so that, in the absence of signals CBR* and IRAS, oscillator control 114 raises signal OEN*, terminating oscillation at time T128. In response to OEN* high, mode logic 410 forces counter 122 to the initial count by raising signal LD at time T130. Mode logic 410 takes signal SREF low to disable gate 126 and to provide signal CK4US to counter 122 in preparation for the next conditional cycle. Finally, signal SV is removed prior to the next refresh cycle, for example, at time T134.

At time T132, signal RAS* falls to test whether a time T120 to the time RAS* falls satisfies a minimum $t_{RPS}$ timing specification, i.e. whether the time T120 to the time RAS* fell was sufficient for proper refreshing of the cell or cells addressed in the final refresh cycle. If data (at the address used in the final refresh cycle) as read via a read cycle illustrated from time T130 to time T142 does not match the data previously stored at that address, the time from time T120 to the time signal RAS* fell did not meet the minimum $t_{RPS}$ specification. When the address used in the final refresh cycle is not known, all addresses are read and compared to data previously stored, for example, during the write cycle beginning at time T10. Having discussed how to test a minimum $t_{RPS}$ specification using the embodiment shown in FIG. 6, we now turn to a circuit realization of the block diagram.

Figure 8:
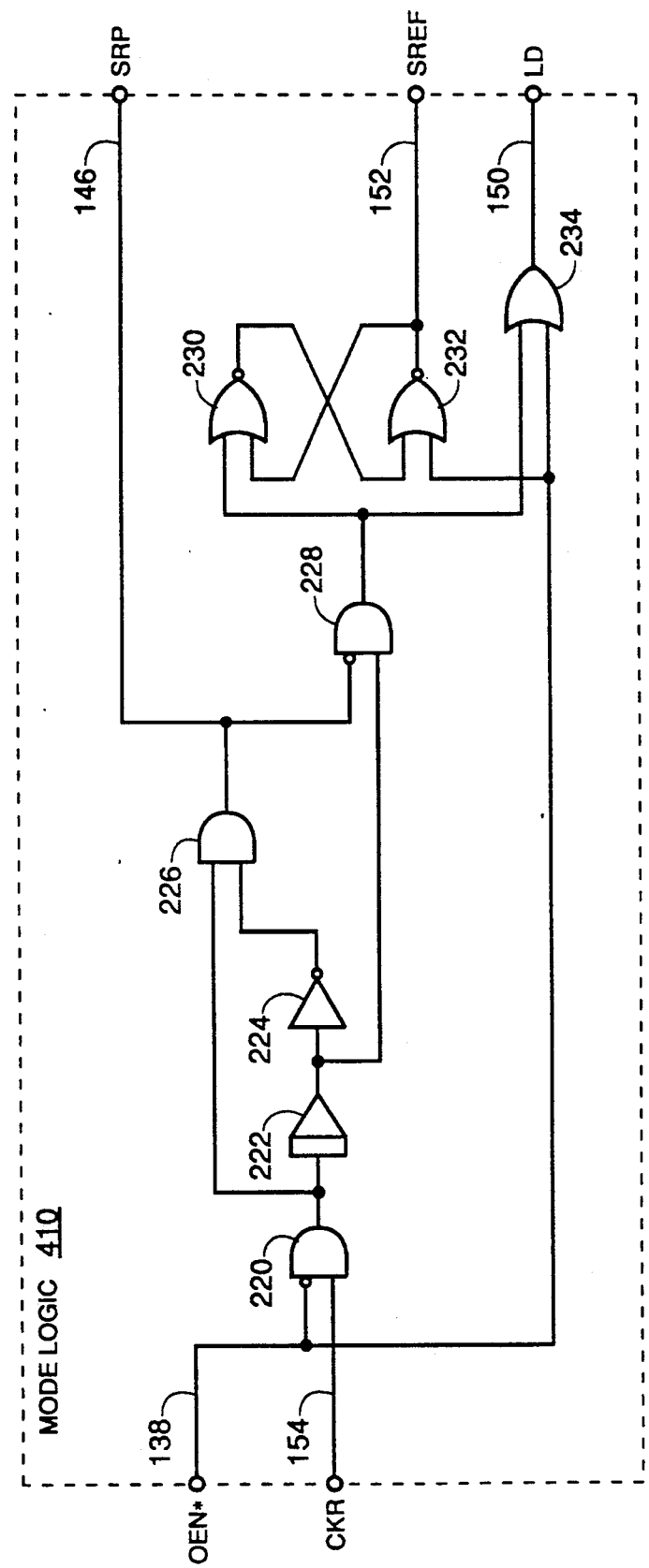
FIG. 8 is a schematic diagram of mode logic 410 shown in FIG. 6.

FIG. 8 is a schematic diagram of mode logic 410 shown in FIG. 6. Similarly identified signals, lines, and functional blocks shown in FIG. 5 and in FIG. 8 perform identical functions. In FIG. 8, signals OEN*, CKR, SREF, and LD operate in the manner as already discussed with FIG. 2 and with timing diagrams in FIG. 3 and FIG. 7. The output of gate 226 shown in FIG. 8 provides signal SRP on line 146. In other respects, signal SRP operates in the manner already discussed with FIG. 2 and with timing diagrams in FIGS. 3 and 7.

When making a measurement of the time $t_{RPS}$ using an embodiment consistent with signal timing shown in FIG. 4, the signal RAS* should be taken high with or as soon after the signal TEST2 is taken low. Although signal transitions shown on FIG. 4 are spatially separated to clearly show causative relations, the figure is not to scale and near simultaneous transitions are within the scope of the invention disclosed. If other than simultaneous transitions of RAS* and TEST2 are used in the measurement, the skilled artisan knows to make an allowance for the extent of time between the falling edge of signal TEST2 and the rising edge of signal RAS* for an accurate measurement.

When making a measurement of $t_{RPS}$ using an embodiment consistent with signal timing shown in FIG. 7, the signal RAS* should make a transition soon after the rising edge of signal BIRAS. Although the signals are shown as occurring at time T120, the skilled artisan knows to make an allowance for the actual extent of time between the rising edge of signal BIRAS and signal RAS* for an accurate measurement.

The inventor considers embodiments consistent with FIG. 2 to be preferred because measurement of $t_{RPS}$ can be made with somewhat greater accuracy as discussed above. In embodiments consistent with FIG. 6, signal BIRAS is coupled to a DQ line through data-out buffers 16 which may add a delay that is difficult to predict due to variation in the fabrication process.

In an alternate and equivalent embodiment not shown, counter 122 is eliminated. As is well known in the art, the generation of signal CKR can be accomplished by an oscillator without frequency division.

The foregoing description discusses preferred embodiments of the present invention, which may be changed or modified without departing from the scope of the present invention.

For example, those skilled in the art understand that the logical elements described above may be formed using a wide variety of logical gates employing any polarity of input or output signals and that the logical values described above may be implemented using different voltage polarities. As an example, an AND element may be formed using an AND gate or a NAND gate when all input signals exhibit a positive logic convention or it may be formed using an OR gate or a NOR gate when all input signals exhibit a negative logic convention.

These and other changes and modifications are intended to be included within the scope of the present invention.

While for the sake of clarity and ease of description, several specific embodiments of the invention have been described; the scope of the invention is intended to be measured by the claims as set forth below. The description is not intended to be exhaustive or to limit the invention to the form disclosed. Other embodiments of the invention will be apparent in light of the disclosure to one of ordinary skill in the art to which the invention applies.

The words and phrases used in the claims are intended to be broadly construed. A "system" refers generally to electrical apparatus and includes but is not limited to a packaged integrated circuit, an unpackaged integrated circuit, a combination of packaged or unpackaged integrated circuits or both, a microprocessor, a microcontroller, a memory, a register, a charge-coupled device, combinations thereof, and equivalents.

A "signal" refers to mechanical and/or electromagnetic energy conveying information. When elements are coupled, a signal can be conveyed in any manner feasible in light of the nature of the coupling. For example, if several electrical conductors couple two elements, then the relevant signal comprises the energy on one, some, or all conductors at a given time or time period. When a physical property of a signal has a quantitative measure and the property is used by design to control or communicate information, then the signal is said to be characterized by having a "value." For a binary (digital) signal, the two characteristic values are called logic "levels."

What is claimed is:

1. A system for providing an output data signal, the system responsive to a first control signal, a second control signal, and an input data signal, the system comprising:
   a. a dynamic storage cell;
   b. means, coupled to the cell, for storing data in the cell in response to the input data signal and the first control signal, and for providing the output data signal in response to the second control signal;
   c. refreshing means, coupled to the cell, for refreshing the cell after an absence of the first and the second control signal for a first time, and for refreshing the cell in response to a third control signal; and
   d. detecting means, coupled to the refreshing means, for providing the third control signal in response to a test signal input to the system.

2. The system of claim 1 wherein the cell is one of a plurality of cells arranged in a storage ring.

3. The system of claim 2 wherein the storage ring comprises a charge coupled device.

4. The system of claim 1 wherein the cell is one of a plurality of cells arranged in an array of rows and columns.

5. The system of claim 4 wherein:
   a. the system is responsive to a row address strobe and a column address strobe; and
   b. the first time begins when the row address strobe is received after the column address strobe is received.

6. The system of claim 4 wherein the system further comprises serial access means and the second control signal comprises a transfer signal for transferring data from the array to the serial access means.

7. The system of claim 1 wherein:
   a. the system further comprises a first line for conveying a first portion of the first control signal and a first portion of the test signal; and
   b. the detecting means further comprises a comparator coupled to the first line for generating the third control signal after a voltage on the first line differs from a threshold voltage.

8. The system of claim 6 wherein the system is powered by a supply voltage and the threshold voltage is greater than the supply voltage.

9. The system of claim 6 wherein the first portion of the first control signal conveyed on the first line is an address signal for selecting the cell.

10. The system of claim 9 wherein:
    a. the system further comprises a second line for conveying a second portion of the first control signal and a second portion of the test signal; and
    b. the second portion of the first control signal conveyed on the second line is a write enable signal.

11. The system of claim 10 wherein the detecting means provides the third control signal after receiving the first portion of the test signal and receiving the second portion of the test signal.

12. The system of claim 1 wherein the cell is one of a plurality of cells, and the refreshing means comprises:
    a. a clock circuit for providing a clock signal; and
    b. cell selecting means, coupled to the plurality of cells and coupled to the clock circuit, for selecting successive cells of the plurality of cells to be refreshed in response to the clock signal.

13. The system of claim 12 wherein the clock circuit further comprises:
    a. an oscillator for generating an oscillator signal; and
    b. a multiplexer coupled to the oscillator for receiving the oscillator signal and responsive to the test signal, the multiplexer coupled to the selecting means for providing either of the oscillator signal and the test signal to the selecting means.

14. The system of claim 13 wherein:
    a. the multiplexer is responsive to a multiplexer control signal;
    b. the test signal comprises an enable signal and a test clock signal; and
    c. the refreshing means further comprises means for providing the multiplexer control signal in response to the enable signal and means for coupling the test clock signal to the multiplexer.

15. The system of claim 14 wherein the first time is a binary multiple of the time between successive refresh operations.

16. The system of claim 12 wherein the clock circuit comprises a timer coupled to the cell selecting means to provide the clock signal, the timer for measuring the time between successive clock signals, the timer coupled to the first control signal and to the second control signal for detecting the passage of the first time.

17. The system of claim 12 wherein the plurality of cells is arranged in a plurality of rows, and the selecting means selects a first plurality of cells in a first row for a refresh operation, and selects a second plurality of cells in a second row for a second refresh operation.

18. The system of claim 1 wherein the first control signal enables a late write operation.

19. A method for verifying refreshing of a cell of a system capable of self refreshing, the method comprising the steps of:
    storing data in the cell;
    enabling self refreshing;
    directing self refreshing at a first time by inputting to the system a test signal so that refreshing of the cell begins on receipt of the test signal;
    disabling self refreshing at a second time;
    reading data from the cell;
    determining that the period from the first time to the second time is sufficient for refreshing by comparing the data read to the data stored.

20. The method of claim 19 wherein the step of directing comprises the steps of:
    inputting to the system a first signal characterized by having a magnitude above a threshold level; and
    inputting to the system a second signal characterized by a transition from a first level to a second level so that refreshing begins after receipt of the transition.

21. The method of claim 19 wherein the step of enabling self refreshing further comprises the steps of:

receiving a column address strobe then receiving a row address strobe; and waiting a predetermined period of time during which the row address strobe and the column address strobe are absent.

22. A method for verifying refreshing of a cell of a system capable of self refreshing, the method comprising the steps of:

storing data in the cell;

enabling self refreshing;

enabling the output of a refresh cycle signal occurring at a first time;

disabling self refreshing at a second time;

reading data from the cell; and determining that the period from the first time to the second time is sufficient for refreshing by comparing the data read to the data stored.

23. The method of claim 22 wherein the step of enabling comprises the steps of:

inputting to the system a signal characterized by having a magnitude above a threshold level; and comparing the magnitude to the threshold level.

24. The method of claim 22 wherein the system receives a power signal having a voltage, and the threshold level is characterized by having a voltage whose absolute value is in excess of the absolute value of the voltage of the power signal.

25. A system for providing an output data signal, the system responsive to a first control signal, a second control signal, an input data signal, and a test signal, the system comprising:

a. a dynamic storage cell;

b. means, coupled to the cell, for storing data in the cell in response to the input data signal and the first control signal, and for providing the output data signal in response to the second control signal;

c. refreshing means, coupled to the cell, for refreshing the cell after an absence of the first and the second control signal for a first time, the refreshing means providing a refresh cycle signal; and d. detecting means, coupled to the refreshing means, for enabling outputting of the refresh cycle signal in response to the test signal.

26. The system of claim 25 wherein the cell is one of a plurality of cells arranged in a storage ring.

27. The system of claim 26 wherein the storage ring comprises a charge coupled device.

28. The system of claim 26 wherein the cell is one of a plurality of cells arranged in an array of rows and columns.

29. The system of claim 28 wherein:

a. the system is responsive to a row address strobe and a column address strobe; and b. the first time begins when the row address strobe is received after the column address strobe is received.

30. The system of claim 28 wherein the system further comprises serial access means and the second control signal comprises a transfer signal for transferring data from the array to the serial access means.

31. The system of claim 25 wherein:

a. the system further comprises a first line for conveying a first portion of the first control signal and a first portion of the test signal; and b. the detecting means further comprises a comparator coupled to the first line for generating the third control signal after a voltage on the first line differs from a threshold voltage.

32. The system of claim 31 wherein the system is powered by a supply voltage and the threshold voltage is greater than the supply voltage.

33. The system of claim 31 wherein the first portion of the first control signal conveyed on the first line is an address signal for selecting the cell.

34. The system of claim 25 wherein the cell is one of a plurality of cells, and the refreshing means comprises:

a. a clock circuit for providing a clock signal; and b. cell selecting means, coupled to the plurality of cells and coupled to the clock circuit, for selecting successive cells of the plurality of cells to be refreshed in response to the clock signal.

35. The system of claim 34 wherein the clock circuit further comprises:

a. an oscillator for generating an oscillator signal; and b. a multiplexer coupled to the oscillator for receiving the oscillator signal, the multiplexer responsive to the test signal, the multiplexer coupled to the selecting means for providing either of the oscillator signal and the test signal to the selecting means.

36. The system of claim 34 wherein the clock circuit comprises a timer coupled to the cell selecting means to provide the clock signal, the timer for measuring the time between successive clock signals, the timer coupled to the first control signal and to the second control signal for detecting the passage of the first time.

37. The system of claim 36 wherein the first time is a binary multiple of the time between successive refresh operations.

38. The system of claim 34 wherein the plurality of cells is arranged in a plurality of rows, and the selecting means selects a first plurality of cells in a first row for a refresh operation, and selects a second plurality of cells in a second row for a second refresh operation.

39. The system of claim 25 wherein the first control signal enables a late write operation.

40. The system of claim 25 wherein the system comprises a line for conveying the output data signal and the refresh cycle signal.

41. A dynamic memory, responsive to an address signal, and an address strobe having a transition, the memory providing a data signal, the memory comprising:

a. a first line for conveying a portion of the address signal and for conveying a first signal;

b. a latch coupled to the first line and responsive to the address signal and to the address strobe for providing a latched address signal;

c. a counter for providing a refresh address signal after receiving a second selected signal;

d. a timer for measuring a predetermined time, for providing a first control signal after an absence of the address strobe for the predetermined time, and for providing a first start signal;

e. a second line for conveying a second signal;

f. a detector coupled to the first line for providing a second control signal when the first signal is received;

g. a first switch, coupled to the timer and enabled responsive to the first control signal, the first switch for providing a first selected signal, the first selected signal responsive to the refresh address signal when enabled, the first selected signal responsive to the latched address signal when disabled;

h. a second switch, coupled to the detector and enabled responsive to the second control signal, the second switch for providing the second selected signal, the second selected signal responsive to the second start signal when enabled, the second selected signal responsive to the first start signal when disabled;
i. a dynamic memory cell for providing the data signal responsive to stored data, the cell coupled to the first switch and responsive to the first selected signal so that when the first switch is enabled the memory cell begins refreshing after the occurrence of the second selected signal;
j. wherein refreshing is interrupted when the address strobe transition is received during refreshing; and
k. wherein the data signal conveys stored data when refreshing was completed without interruption.

42. A dynamic memory, responsive to an address signal, and an address strobe having a transition, the memory providing a data signal, the memory comprising:
  a. a first line for conveying a portion of the address signal and for conveying a first signal;
  b. a latch coupled to the first line and responsive to the address signal and to the address strobe for providing a latched address signal;
  c. a counter for providing a refresh address signal after receiving a start signal;
  d. a timer for measuring a predetermined time, for providing a first control signal after an absence of the address strobe for the predetermined time, and for providing the start signal;
  e. a detector coupled to the first line for providing a second control signal when the first signal is received;
  f. a first switch, coupled to the timer and enabled responsive to the first control signal, the first switch for providing a first selected signal, the first selected signal responsive to the refresh address signal when enabled, the first selected signal responsive to the latched address signal when disabled;
  g. a dynamic memory cell for providing the data signal responsive to stored data, the cell coupled to the first switch and responsive to the first selected signal so that when the first switch is enabled the memory cell begins refreshing after the occurrence of the start signal;
  h. a second line for conveying the data signal and a buffered signal;
  i. a buffer for providing on the second line, when enabled by the second control signal, the buffered signal in response to the start signal;
  j. wherein refreshing is interrupted when the address strobe transition is received during refreshing; and
  k. wherein the data signal conveys stored data when refreshing was completed without interruption.

* * * * *